United States Patent
Li et al.

(10) Patent No.: US 10,886,328 B1
(45) Date of Patent: Jan. 5, 2021

(54) MONOLITHICALLY INTEGRATED GAN LIGHT-EMITTING DIODE WITH SILICON TRANSISTOR FOR DISPLAYS

(71) Applicant: International Business Machines Corporation, Armonk, NY (US)

(72) Inventors: Ning Li, White Plains, NY (US); Ko-Tao Lee, Yorktown Heights, NY (US); Shawn Xiaofeng Du, Mohegan Lake, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/699,792

(22) Filed: Dec. 2, 2019

(51) Int. Cl.
*H01L 27/15* (2006.01)
*H01L 33/00* (2010.01)
*H01L 33/50* (2010.01)
*H01L 33/32* (2010.01)

(52) U.S. Cl.
CPC .......... *H01L 27/156* (2013.01); *H01L 33/007* (2013.01); *H01L 33/32* (2013.01); *H01L 33/504* (2013.01)

(58) Field of Classification Search
CPC ..... H01L 27/156; H01L 33/007; H01L 33/32; H01L 33/504
See application file for complete search history.

(56) References Cited

U.S. PATENT DOCUMENTS

| | | | |
|---|---|---|---|
| 7,851,909 B2 | 12/2010 | Mishra | |
| 9,331,076 B2 * | 5/2016 | Bayram | H01L 27/06 |
| 9,406,530 B2 | 8/2016 | Cohen | |
| 9,478,708 B2 | 10/2016 | Gallagher | |
| 9,496,347 B1 | 11/2016 | Cheng | |
| 9,564,526 B2 | 2/2017 | Bayram | |
| 9,653,441 B1 * | 5/2017 | Chen | H01L 29/2003 |
| 9,654,004 B1 | 5/2017 | Deligianni | |
| 9,685,329 B2 | 6/2017 | Gallagher | |
| 9,722,039 B2 | 8/2017 | Bedell | |
| 9,756,697 B2 | 9/2017 | Odnoblyudov | |
| 9,806,615 B1 | 10/2017 | Deligianni | |
| 9,922,830 B2 | 3/2018 | Chang | |
| 9,935,175 B1 | 4/2018 | Lee | |
| 9,947,533 B2 | 4/2018 | Cheng | |

(Continued)

OTHER PUBLICATIONS

"SBIR Phase II: Monolithic Integration of LED Arrays and Silicon TFTs for Super High Brightness Microdisplays", SBIR.gov, last printed on Nov. 22, 2019, 3 pages, <https://www.sbir.gov/sbirsearch/detail/704662>.

(Continued)

*Primary Examiner* — Victor A Mandala
(74) *Attorney, Agent, or Firm* — Alexander G. Jochym

(57) ABSTRACT

An approach to forming a full color micro-display that includes using a plurality of micro-light emitting diodes formed in a silicon on insulator substrate, where the plurality of micro-light emitting diodes include a plurality of red micro-light emitting diodes, a plurality of green micro-light emitting diodes, and a plurality of blue micro-light emitting diodes. Additionally, the approach includes forming a plurality of transistor devices in the silicon on insulator substrate, wherein each transistor device of the plurality of transistor devices acts as a switch connecting to a micro-light emitting diode of the plurality of micro-light emitting diodes.

16 Claims, 4 Drawing Sheets

(56) References Cited

U.S. PATENT DOCUMENTS

| | | | |
|---|---|---|---|
| 10,032,750 | B2 | 7/2018 | Deligianni |
| 10,217,641 | B2 | 2/2019 | Gallagher |
| 2009/0179216 | A1* | 7/2009 | Xuan ................. H01L 33/0004 |
| | | | 257/98 |
| 2011/0260210 | A1 | 10/2011 | Su |
| 2017/0250167 | A1* | 8/2017 | Bower ................. H01L 25/167 |
| 2018/0034369 | A1 | 2/2018 | Deligianni |
| 2018/0138357 | A1 | 5/2018 | Henley |
| 2019/0058085 | A1 | 2/2019 | Ahmed |
| 2019/0139949 | A1* | 5/2019 | Liu .................... H01L 33/0093 |
| 2019/0244955 | A1 | 8/2019 | Zhang |

OTHER PUBLICATIONS

Ding, et al., "Micro-LEDs, a Manufacturability Perspective", Appl. Sci. 2019, 9, 1206, 15 pages, <https://www.mdpi.com/2076-3417/9/6/1206/xml>.

Lee, et al., "Ultra Low Parasitic Inductance Integrated Cascode GaN Devices", U.S. Appl. No. 16/355,008, filed Mar. 15, 2019.

Liu, Zhaojun, "Monolithic LED Microdisplay on Active Matrix Substrate Using Flip-Chip Technology", IEEE Journal of Selected Topics in Quantum Electronics—Sep. 2009, 6 pages, <https://www.researchgate.net/publication/224565418_Monolithic_LED_Microdisplay_on_Active_Matrix_Substrate_Using_Flip-Chip_Technology>.

Zhang, et al., "Active Matrix Monolithic LED Micro-Display Using GaN-on-Si Epilayers", IEEE Photonics Technology Letters, vol. 31, No. 11, Jun. 1, 2019, pp. 865-868, <https://ptc.home.ece.ust.hk/Papers/2019/xzhang_PTL2019.pdf>.

\* cited by examiner

US 10,886,328 B1

MONOLITHICALLY INTEGRATED GAN LIGHT-EMITTING DIODE WITH SILICON TRANSISTOR FOR DISPLAYS

BACKGROUND OF THE INVENTION

The present invention relates generally to the field of display technology and more particularly to gallium nitride light-emitting diodes monolithically integrated with silicon semiconductor devices in a display.

Displays based on inorganic light-emitting diodes (LEDs) are considered one of the most promising advancements in display technologies for the next generation of displays. The LED devices for use in next generation displays provide the high efficiency and the long-life current LED lighting. However, the production of micro-LEDs in the less than one hundred nanometer range for next generation displays create technical challenges associated with increasing complexity of manufacturing processes for such small LED devices. Opportunities for next generation displays with brighter and more energy efficient displays using mini-LEDs and micro-LEDs include televisions, smart phones, smart watches, laptops, automotive displays, small screen consumer applications in workout equipment, gas pump displays and the like.

Conventional approaches to forming micro-LED displays involve forming micro-LEDs on a source semiconductor substrate and transferring the micro-LED to a target semiconductor substrate that includes additional driving electronics or semiconductor devices to provide the microdisplay. Current LED transfer methods to transfer micro-LEDs from the source substrate to the target substrate can include custom pick and place tooling or stamp transfer processes.

SUMMARY

A full color micro-display including a plurality of micro-light emitting diodes in a silicon on insulator substrate. The full color micro-display where the plurality of micro-light emitting diodes include a plurality of red micro-light emitting diodes, a plurality of green micro-light emitting diodes, and a plurality of blue micro-light emitting diodes. Additionally, the full color micro-display includes a plurality of transistor devices in the silicon on insulator substrate, wherein each transistor device of the plurality of transistor devices acts as a switch connecting to a micro-light emitting diode of the plurality of micro-light emitting diodes.

BRIEF DESCRIPTION OF THE DRAWINGS

The above and other aspects, features, and advantages of various embodiments of the present invention will be more apparent from the following description taken in conjunction with the accompanying drawings.

DETAILED DESCRIPTION

Figure 1:
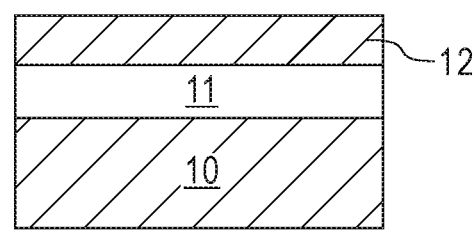
FIG. 1 is a cross-sectional view of a semiconductor structure after forming a semiconductor on insulator substrate in accordance with an embodiment of the present invention.

Embodiments of the present invention recognize microlight emitting diode (LED) displays require less power than liquid crystal displays and provide advantages over organic light emitting diodes (OLED) for displays. Embodiments of the present invention recognize that micro-LED displays using LED devices coupled with driving semiconductor devices are assembled on a target substrate using pick and place equipment and transfer processes of LED devices form on a source substrate and then, transferred and bonded to the target substrate. Embodiments of the present invention recognize that pick and place processes and stamp transfer processes may require customized tooling. Embodiments of the present invention further recognize that pick and place integration of micro-LED devices with silicon thin film transistors is difficult and costly. Embodiments of the present invention recognize a need for full color, high-resolution micro-LED displays where micro-LEDs are monolithically formed and integrated with silicon-based semiconductor devices on a substrate using complimentary metal-oxide semiconductor processes providing an effective method of high-resolution, micro-LED display production.

Embodiments of the present invention provide methods of monolithically integrating micro-LEDs with silicon-based semiconductor devices on a single silicon on insulator (SOI)

substrate where the micro-LEDs formed are capable of providing high resolution, full color micro-displays. Embodiments of the present invention provide a method of producing a micro-LED display that does not require micro-LED device transfer to a target substrate. Embodiments of the present invention provide a method of a plurality forming red, green, and blue micro-LEDs, each connecting to a transistor and control integrated circuit on a single SOI substrate for use in a full color micro-display.

Detailed embodiments of the claimed structures and methods are disclosed herein. The method steps described below do not form a complete process flow for manufacturing integrated circuits, such as, magnetic tape heads for tape drives. The present embodiments can be practiced in conjunction with the integrated circuit fabrication techniques currently used in the art, for magnetic tape heads, and only so much of the commonly practiced process steps are included as are necessary for an understanding of the described embodiments. The figures represent cross-section portions of a magnetic tape head and/or magnetic tape after fabrication and are not drawn to scale, but instead are drawn to illustrate the features of the described embodiments. Specific structural and functional details disclosed herein are not to be interpreted as limiting, but merely as a representative basis for teaching one skilled in the art to variously employ the methods and structures of the present disclosure. In the description, details of well-known features and techniques may be omitted to avoid unnecessarily obscuring the presented embodiments.

References in the specification to "one embodiment", "other embodiment", "another embodiment", "an embodiment", etc., indicate that the embodiment described may include a particular feature, structure or characteristic, but every embodiment may not necessarily include the particular feature, structure or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "over", "on", "positioned on" or "positioned atop" mean that a first element is present on a second element wherein intervening elements, such as an interface structure, may be present between the first element and the second element. The term "direct contact" means that a first element and a second element are connected without any intermediary conducting, insulating or semiconductor layers at the interface of the two elements.

In the interest of not obscuring the presentation of the embodiments of the present invention, in the following detailed description, some of the processing steps or operations that are known in the art may have been combined together for presentation and for illustration purposes and in some instances may not have been described in detail. In other instances, some processing steps or operations that are known may not be described. It should be understood that the following description is rather focused on the distinctive features or elements of the various embodiments of the present invention.

FIG. 1 is a cross-sectional view of semiconductor structure 100 after forming the semiconductor on insulator (SOI) substrate in accordance with an embodiment of the present invention. As depicted, semiconductor structure 100 includes silicon layer 10, buried oxide layer (BOX) 11, and silicon layer 12, where the combination of silicon layer 12 over BOX 11, and BOX 11 over silicon layer 10 creates the SOI substrate. The SOI substrate, formed using conventional semiconductors processed for SOI manufacture, can be a hybrid SOI substrate which includes a silicon substrate under an oxide layer (e.g., BOX 11) that has a different crystallographic structure than that of the silicon layer covering the oxide layer. In various embodiments, silicon layer 10 has a (111) crystal orientation and silicon layer 12 over BOX 11 has a (100) crystal orientation (e.g., a surface of silicon layer 10 is in a (100) crystal orientation and a surface of silicon layer 12 is in a (111) crystal orientation). BOX 11 can be a buried insulating layer in a SOI substrate. For example, BOX 11 can be composed of a dielectric material, such as silicon dioxide, silicon nitride, silicon oxynitride, boron nitride or a combination thereof.

In various embodiments, silicon layer 12 over BOX 11 is one or more of doped, includes regions of silicon layer 12 with doping, is stained, or includes portions of silicon layer 12 that are strained. For example, a dopant in silicon layer 12 can be an n-type dopant (e.g., P, As, Sb, etc.) or a p-type dopant (i.e., B, Al, Ga, In, etc.). In some embodiments, doping of more one than region of silicon layer 12 occurs with more than one dopant. For example, one region of silicon layer 12 includes an n-type dopant while other regions of silicon layer 12 can be doped with a p-type dopant.

Figure 2:
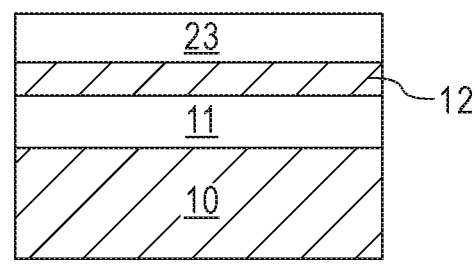
FIG. 2 is a cross-sectional view of the semiconductor structure after forming an oxide layer on the semiconductor structure in accordance with an embodiment of the present invention.

FIG. 2 is a cross-sectional view of semiconductor structure 200 after forming oxide layer 23 on semiconductor structure 200 in accordance with an embodiment of the present invention. In various embodiments, a thermal oxidation of silicon layer 12 occurs. For example, a layer of SiO2 can be formed on silicon layer 12. In some embodiments, an oxide or a nitride material is deposited by known deposition methods such as chemical vapor deposition (CVD) or atomic layer deposition (ALD) as oxide layer 23.

Figure 3:
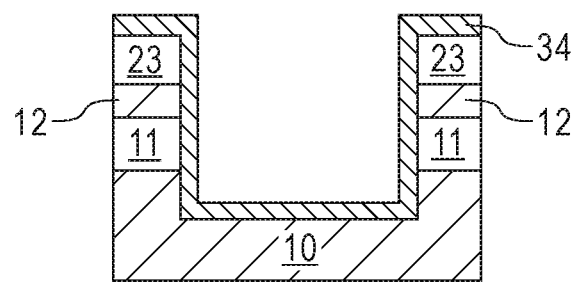
FIG. 3 is a cross-sectional view of the semiconductor structure after forming a trench exposing a sub-surface of a bottom silicon layer and depositing a first spacer material layer r in accordance with an embodiment of the present invention.

FIG. 3 is a cross-sectional view of semiconductor structure 300 after forming a trench exposing a portion of silicon layer 10 and depositing spacer layer 34 along bottom and sidewall surfaces of the trench and over the top surface of oxide layer 23 in accordance with an embodiment of the present invention. As depicted, FIG. 3 includes the elements of FIG. 2 after a portion of each of oxide layer 23, silicon layer 12, BOX 11, and silicon layer 10 are removed to form a trench in semiconductor structure 300. Using a semiconductor etch process, such as reactive ion etch (RIE) or the like, a trench can be formed in semiconductor structure 300 by removing portions of oxide layer 23, silicon layer 12, BOX 11, and silicon layer 10. A portion of silicon layer 10 remains under the trench. In various embodiments, a size of the trench after removing the portions of oxide layer 23, semiconductor structure 200 by removing portions of oxide layer 23, silicon layer 12, BOX 11, and silicon layer 10 is in the range of 3 um by 3 um to 250 um by 250 um with a depth ranging from 3 um to 50 um. For example, the trench etched in semiconductor structure 200 may be 100 um by 100 um with a depth of 5 um.

After etching the trench using known semiconductor etching processes, a thin layer of a dielectric material for spacer layer 34 is deposited using chemical vapor deposition (CVD) or molecular beam epitaxy (MBE) over exposed top surfaces of semiconductor structure 300, in various embodiments. For example, a thin layer of a SiN dielectric material with a thickness of 5 to 500 microns can be deposited in the trench and over oxide layer 23 forming spacer layer 34. In other examples, spacer layer 34 may be formed from SiO2, Al2O3, a compound nitride dielectric material, or any sidewall spacer material used in semiconductor processes for transistor devices or LED formation. A thickness of spacer layer 34 is limited in order to provide transparency. Spacer layer 34 can provide limited blockage of light emitting from the LED upon completion of the sidewall spacer formed from spacer layer 34 (e.g., after completion of LED 90 in FIG. 9). For this reason, a thickness of spacer layer 34 is limited to 5 to 100 um. For example, a thickness of spacer layer 34 is commonly in the range of 8-15 um thick in an active region of LED device 90 when complete (e.g., in FIG. 9).

Figure 4:
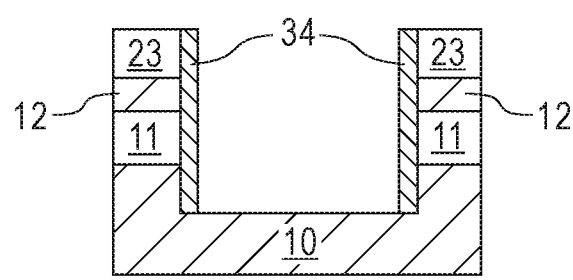
FIG. 4 is a cross-sectional view of the semiconductor structure after etching the first spacer material layer on exposed horizontal surfaces of the semiconductor structure to form a sidewall spacer on sidewalls of the trench in accordance with an embodiment of the present invention.

FIG. 4 is a cross-sectional view of semiconductor structure 400 after etching spacer layer 34 on exposed horizontal surfaces of semiconductor structure 400 to form a sidewall spacer on sidewalls of the trench in accordance with an embodiment of the present invention. As depicted, FIG. 4 includes the elements of FIG. 3 after removing portions of spacer layer 34 from exposed horizontal surfaces of semiconductor structure 400. In various embodiments, an etch removing portions of spacer layer 34 on the top surfaces of oxide layer 23 and spacer layer 34 on a top surface of silicon layer 10 in the trench is complete. For example, a reactive ion etch (RIE) of exposed top surfaces of oxide layer 23 and silicon layer 10 occurs leaving a very thin layer of spacer layer 34 on the sidewalls of the trench. In various embodiments, a thickness of spacer layer 34 on the sidewalls of the trench in semiconductor structure 400 after RIE is in the range of 5 to 20 microns. For example, a thickness of the sidewall spacer created from spacer layer 34 is 10 microns. The very thin layer of spacer layer 34, in the range of 10 microns, remains in an area of the trench corresponding to the active region of the LED formed in FIG. 9. The thinness of spacer layer 34 can be important to reduce or prevent blockage of light emitted from the completed LED.

Figure 5:
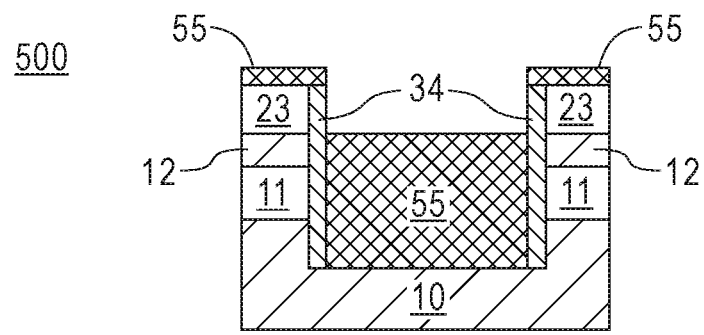
FIG. 5 is a cross-sectional view of the semiconductor structure after forming a light-emitting diode layer on exposed horizontal surfaces of the semiconductor structure in accordance with an embodiment of the present invention.

FIG. 5 is a cross-sectional view of semiconductor structure 500 after forming LED layer 55 on exposed horizontal surfaces of semiconductor structure 500 in accordance with an embodiment of the present invention. LED layer 55 is a layer of a compound semiconductor material capable of emitting light when electrical current runs through the semiconductor material. In various embodiments, a layer of a compound semiconductor Group III-V material is used to form LED layer 55. For example, LED layer 55 may be composed of a compound semiconductor material that is a combination of two or more of the following elements: gallium (Ga), nitride (N), indium (In), arsenic (As), aluminum (Al), and phosphorous (P). In some embodiments, LED layer 55 is a layer of GaN deposited by epitaxial growth on a bottom surface (e.g., silicon layer 10) and a top surface of oxide layer 23. In other embodiments, LED layer 55 is one of InGaN, GaN, GaP, AlInGaP, or AlGaAs. The epitaxial growth of LED layer 55 in the trench is to about the same level as a top surface of silicon layer 12 (e.g., a top surface of LED layer 55 is level with a top surface of silicon layer 12). In various embodiments, doping of LED layer 55 occurs (e.g., n-type doping and p-type doping of LED layer 55). LED layer 55 may be doped using conventional methods, such as, doping incorporated as a part of the epitaxial growth process (e.g., in-situ doping during MBE or metal-organic chemical vapor deposition). A thickness of LED layer 55 may be in the range of 1 um to 50 um. In various embodiments, LED layer 55 is coated with phosphor. For example, a layer of LED layer 55 composed of GaN emitting a blue colored light may be coated with a phosphor material to provide LEDs emitting a red colored or a green colored light. In this example, two different materials may be used to create a red light and a green light in LEDs, such as the LEDs discussed later with reference to FIG. 9 and FIG. 12. In some embodiments, LED layer 55 is coated with a quantum dot to provide red colored LEDs and green colored LEDS.

Figure 6:
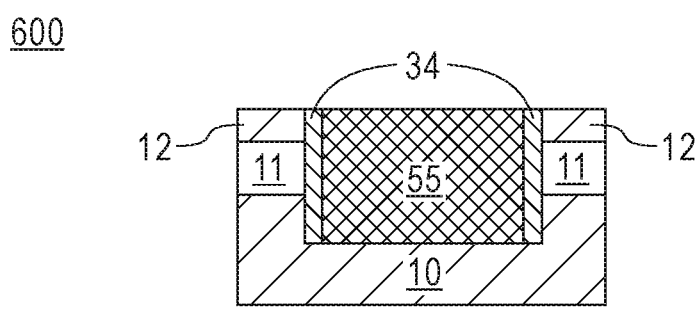
FIG. 6 is a cross-sectional view of the semiconductor structure after chemical-mechanical polishing a top surface to the semiconductor structure in accordance with an embodiment of the present invention.

FIG. 6 is a cross-sectional view of semiconductor structure 600 after a chemical-mechanical polish (CMP) of the top surface to semiconductor structure 600 in accordance with an embodiment of the present invention. The CMP removes oxide layer 23, a top portion of LED layer 55 on oxide layer 23, a portion of spacer layer 34 on the sidewalls of the trench and removes a portion of the top surface of silicon layer 12 while leaving most of silicon layer 12 in semiconductor structure 600. As depicted, FIG. 6 includes a portion of silicon layer 10, a portion of BOX 11, a portion of silicon layer 12, a portion of spacer layer 34, and a portion of LED layer 55 in the trench.

Figure 7:
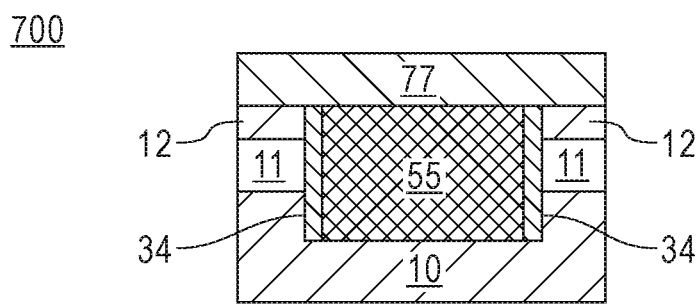
FIG. 7 is a cross-sectional view of the semiconductor structure after depositing a layer of dielectric material on the semiconductor structure in accordance with an embodiment of the present invention.

FIG. 7 is a cross-sectional view of semiconductor structure 700 after depositing dielectric layer 77 on semiconductor structure 700 in accordance with an embodiment of the present invention. As depicted, FIG. 7 includes all of the elements in FIG. 6 and dielectric layer 77 deposited over semiconductor structure 700. In various embodiments, dielectric layer 77 is an oxide, such as, SiO2 or Al2O3. Dielectric layer 77 can be any dielectric material commonly used in semiconductor manufacture that can protect LED layer 55 during the following transistor formation discussed later with respect to FIG. 8. Dielectric layer 77 provides a cap covering LED layer 55 during subsequent semiconductor device processing.

Figure 8:
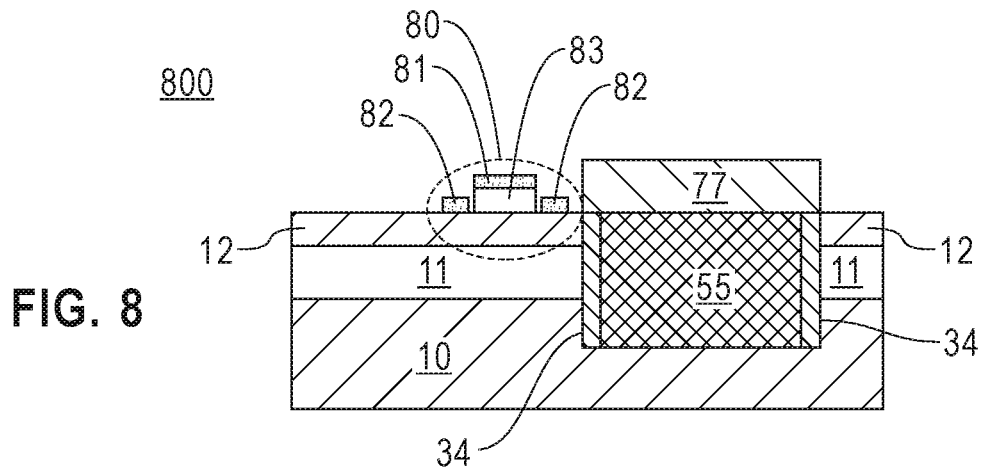
FIG. 8 is a cross-sectional view of the semiconductor structure after forming a silicon-based transistor adjacent to the light-emitting diode layer in accordance with an embodiment of the present invention.

FIG. 8 is a cross-sectional view of semiconductor structure 800 after forming transistor 80 adjacent to LED layer 55 in accordance with an embodiment of the present invention. As depicted, FIG. 8 illustrates semiconductor structure 800 after selectively removing portions of dielectric layer 77 adjacent the trench containing LED layer 55 and forming transistor 80 adjacent to LED layer 55. In various embodiments, a portion of dielectric layer 77 is removed selectively from top surfaces of silicon layer 12 using conventional etch processes while leaving a portion of dielectric layer 77 to form a protective cap on LED layer 55 composed of dielectric layer 77. The cap formed by dielectric layer 77 protects LED layer 55 during subsequent semiconductor processes forming transistor 80.

In various embodiments, transistor 80 is a silicon-based transistor acting as switch for an LED device (e.g., an LED device formed later in FIG. 9 from LED layer 55). For example, transistor 80 is a silicon-based transistor formed with source/drain (S/D) 82, gate dielectric 83, gate metal 81, and a portion of silicon layer 12 beneath or at least, in part, beneath S/D 82 providing a channel, and gate dielectric 83. In various embodiments, transistor 80 is formed adjacent to LED layer 55.

In various embodiments, the portion of silicon layer 12 in transistor 80 is doped with a n-type, a p-type dopant, or a combination of n-type and p-type dopants. In various embodiments, transistor 80 is a metal-oxide semiconductor field-effect transistor (MOSFET). In some embodiments, transistor 80 can be a field-effect transistor (FET), such as an nFET, a pFET, or a junction-gate FET. Multiple transistor 80 can be formed using known complimentary metal-oxide-semiconductor (CMOS) processes for integrated circuit formation.

Gate dielectric 83 may be such as, SiO2, hafnium dioxide ($HfO_2$) but, can be any known transistor gate dielectric material. In various embodiments, gate dielectric 83 is a high-k dielectric material, such as, ZrO2, TiO2, La2O3, Y2O3, LaAlO3, or the like. Gate dielectric 83 may deposited with known deposition processes (e.g., ALD, CVD, etc.) and patterned using convention lithography processes.

In various embodiments, S/D 82 may be composed of known S/D materials, such as, tungsten or titanium. S/D 82 may be deposited with known deposition processes and patterned using convention lithography processes to form a source or a drain adjacent to or abutting gate dielectric 83. In some embodiments, S/D 82 is a doped semiconductor material. For example, S/D 82 may be composed of a doped or heavily doped semiconductor material, such as, silicon, that is doped using conventional methods, such as, ion implantation or the doping may be incorporated as a part of the epitaxial growth process (e.g., in-situ doping during MBE or metal-organic chemical vapor deposition). S/D 82 can be formed with any known CMOS transistor process.

Gate metal 81 can be any transistor gate metal. For example, gate metal 81 may be tungsten, titanium, tantalum, tantalum nitride, polysilicon, or the like that may be deposited as a layer using MBE, CVD, or other similar deposition process. After deposition, gate metal 81 may be selective etched, for example, using lithography processes. In various embodiments, gate metal 81 has a layer of a high k dielectric material included as a gate dielectric.

In various embodiments, transistor 80 is formed with a maximum current capability of 10 mA. A current capability in the 10 mA range provides brightness of a micro-display (e.g., good micro-display visibility in direct sunlight) when processing of semiconductor structure 800 is completed (e.g., after FIG. 10). An ability of transistor 80 to provide a desired current capacity (e.g., 10 mA or less) may be determined, based, at least in part, on geometries and material selection of S/D 82, gate metal 18, gate dielectric 83, and a portion of silicon layer 12 beneath them (e.g., a channel size, doping, etc.) using methods (e.g., design) and processes known to one skilled in the art.

Figure 9:
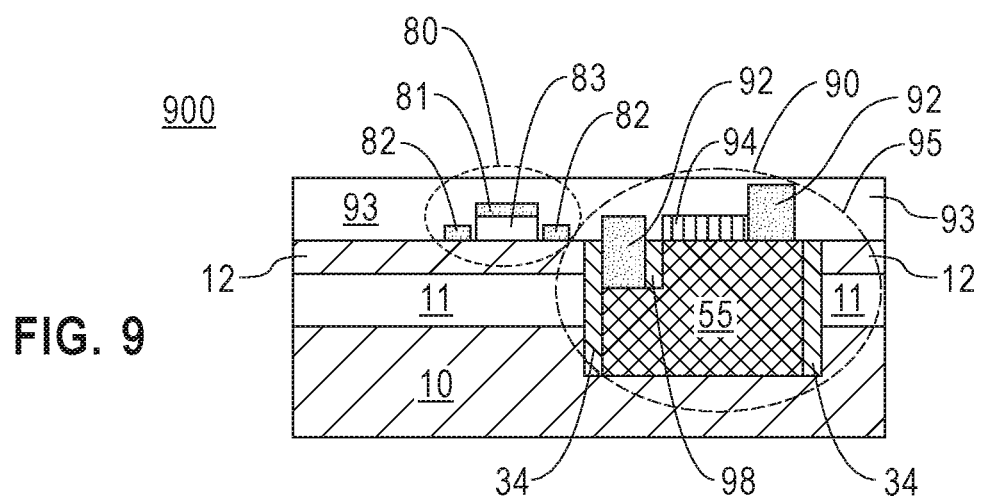
FIG. 9 is a cross-sectional view of the semiconductor structure after forming the light-emitting diode adjacent to the silicon-based transistor in accordance with an embodiment of the present invention.

FIG. 9 is a cross-sectional view of semiconductor structure 900 after forming LED device 90 adjacent to transistor 80 in accordance with an embodiment of the present invention. As depicted, FIG. 9 includes the elements of FIG. 8 after removing dielectric layer 77, forming LED device 90, and depositing an interlayer dielectric (ILD) 93 over semiconductor structure 900.

The formation of LED device 90 includes semiconductor processes commonly used in LED device formation. For example, transparent conducting oxide (TCO) 94 can be deposited with known processes, such as CVD or plasma vapor deposition (PVD), over LED layer 55 and selectively removed from the outside edges of LED layer 55. In some embodiments, the etching process removes TCO 94 over spacer layer 34, and over portions of LED layer 55 sufficiently large to form terminals, such as, terminal 92N and 92P and to deposit spacer 98. Spacer 98 can be formed between terminal 92N and LED layer 55. In other embodiments, the etch process does not remove TCO 94 from the area of terminal 92P. In this case (not depicted in FIG. 9), terminal 92P may be deposited on TCO 94.

A formation of LED device 90, as depicted in FIG. 9, includes a removal of a top portion of LED layer 55 on a left side of LED layer 55 adjacent to or directly in contact with spacer layer 34. After removing the portion of LED layer 55, a deposition of material for terminal 92N occurs using known processes.

In various embodiments, terminal 92N is formed with a terminal material doped with a n-type dopant. In some embodiments, a height of terminal 92N is less than a height of terminal 92P. Terminal 92N and terminal 92P can be composed any known terminal material or terminal metal, such as Ti, Al, Au or Cr.

In various embodiments, terminal 92P is formed from a terminal material doped with a p-type dopant. As depicted in FIG. 9, terminal 92P resides on LED layer 55, in some embodiments, terminal 92P resides on TCO 94. Terminal 92P can extend to a higher height than terminal 92N. In various embodiments, one or more of TCO 94, terminal 92N, terminal 92P, and spacer 98 may be deposited by a lift off process or by a layer deposition over a top surface of semiconductor structure 900 followed by a dry etch to form LED device 90.

After formation of LED device 90, a layer of ILD 93 is deposited over the top surface of semiconductor structure 900. ILD 93 can be any dielectric material used for an ILD in back-end of the line processes (BEOL) in semiconductor manufacture.

Figure 10:
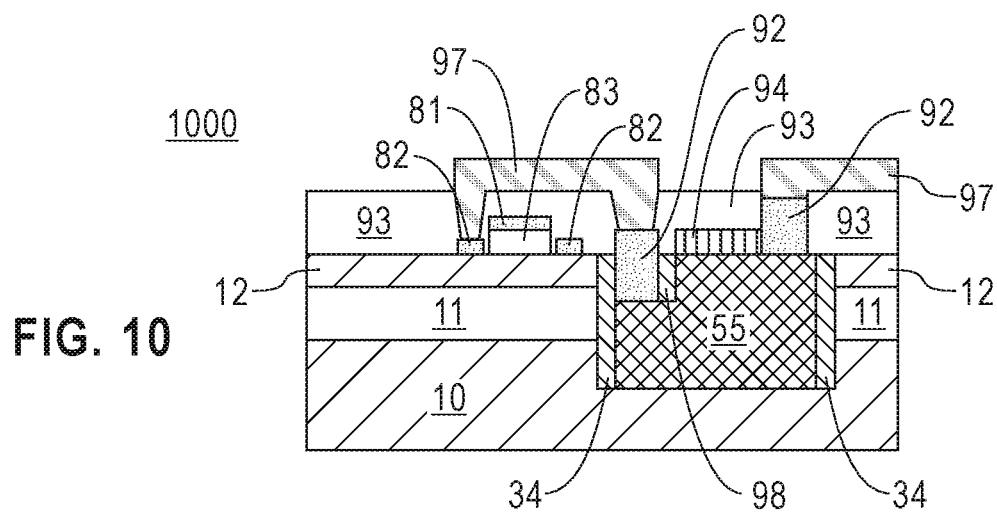
FIG. 10 is a cross-sectional view of the semiconductor structure after depositing back-end of line interconnections in accordance with an embodiment of the present invention.

FIG. 10 is a cross-sectional view of semiconductor structure 1000 after depositing BEOL line interconnections 97 in accordance with an embodiment of the present invention. Interconnections 97 deposited with known BEOL processes can be composed of any BEOL interconnection material, such as, copper or cobalt. In various embodiments, further layers and interconnections (not depicted) in BEOL processes are formed over semiconductor structure 1000. Interconnections 97 connect LED device 90 to other semiconductor devices. For example, interconnections 97 on terminals 92N and 92P connect LED device 90 to transistor 80.

Figure 11:
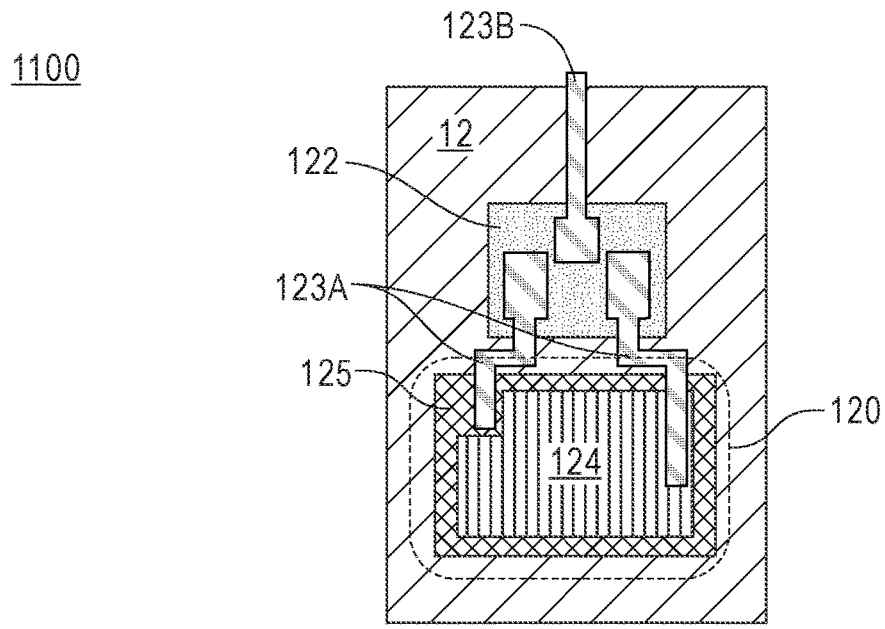
FIG. 11 is a top view of the semiconductor structure looking through the back-end of line dielectric layer and a transparent conducting oxide in FIG. 10 to view the transistor and a top surface of the light-emitting diode device in accordance with an embodiment of the present invention.

FIG. 11 is a top view of semiconductor structure 1100 looking through ILD 93 and TCO 94 in FIG. 10 to view transistor 122 and a top surface of LED 120 in accordance with an embodiment of the present invention. As depicted, FIG. 11 depicts a top surface of silicon layer 12, transistor 122, LED 120, and interconnects 123A and 123B. In various embodiments, transistor 122 is a switch for LED 120. Transistor 122 can include the elements discussed in detail with respect to transistor 80 in FIG. 8. LED 120 can include the elements discussed in detail with respect to LED device 90 in FIG. 9.

As depicted, FIG. 11 includes a top surface of LED 120 that includes LED layer 124 and spacer 135 (e.g., looking through ILD 93 and TCO 94 present in FIGS. 9 and 10). Spacer 135 can be any spacer material. Spacer 135 includes spacer layer 34 and spacer 98 discussed previously with respect to FIG. 3 and FIG. 9, respectively. In various embodiments, LED layer 124 is a layer of GaN. In various embodiments, LED layer 124 is a layer of GaN coated with phosphor.

As known to one skilled in the art, using phosphor in conjunction with GaN in LED 120 can create red and green colored LEDs for LED 120. For example, forming LED 120 occurs using LED layer 124 composed of GaN, where LED layer 124 may be coated with an epoxy phosphate material producing green colored LED 120, LED layer 124 coated with a phosphor material producing red colored LED 120, and LED layer 124 composed of GaN producing a blue color for LED 120. Using GaN for LED layer 124, where LED layer 124 coated with a phosphor material can create green colored LED 120, LED layer 124 coated with another phosphor material can create a red colored LED 120, and LED layer 124 (not coated) creates a blue colored LED 120 for a full color red, green and blue (RGB) micro-display. In this manner, producing a large number of LED 120 with GaN as LED layer 124 can emit red, green, and blue light for a micro-display. As known to one skilled in the art, the phosphor may be included in an encapsulant or the phosphor can be applied before or after an encapulant when coating LED layer 124. In another embodiment. LED layer 124 is composed of InGaN coated with a phosphor to create a red LED or a green LED.

In some embodiments, one of GaN or InGaN used for LED layer 124 where the GaN layer and the InGaN are each coated with a quantum dot. As known to one skilled in the art, quantum dots may provide a down conversion as quantum dots can cause the emitted wavelength from the LED to be longer with lower energy to create red and green LEDs. Quantum dots in LEDs may be formed by doping epitaxial layers of LED layer 124 (e.g., in GaN for LED layer 124 doping of epitaxial layers with Al, In, and P can achieve desired quantum dot structure and resulting desired LED color). Using quantum dots on one of GaN or InGaN as LED layer 124 can provide green colored and red colored LEDs for LED 120. In this manner, LED layer 124 composed of either GaN or InGaN can provide blue colored LEDs and using quantum dots, provide red and green colored LEDs for a full color micro-display.

In various embodiments, a plurality LED 120 are produced where a number of red LED 120, green LED 120, and blue LED 120 provide a full color RGB capability when integrated in micro-display using a plurality of micro-scaled LEDs (i.e., LED 120). In various embodiments, each of LED 120 formed with the processes and structures depicted in FIGS. 1-11 have a size of 3 um by 3 um to 250 microns by 250 microns. In various embodiments, each LED 120 is connected by two interconnects 124A to transistor 122. Each interconnect of interconnects 124A can connect a terminal (not depicted) in LED 120 to transistor 122. For example, terminal 92A and terminal 92B in FIG. 10 connects to one of S/D 82 also depicted in FIG. 10. In this way, transistor 122 can act as a switch for LED 120. In various embodiments, interconnect 123B connects transistor 122 to a control integrated circuit (I/C) device (not depicted) or other semiconductor devices.

In various embodiments, a plurality of red LED 120, a plurality green LED 120, and a plurality of blue LED 120 with each LED 120 of the plurality of LED 120 connects to a transistor 122 for switching and are combined together in a high-resolution micro-display. In this manner, each LED 120 connects to one transistor 122 and the combination can be a pixel in the high-resolution micro-display that can provide a high level of brightness and full color capability.

Figure 12:
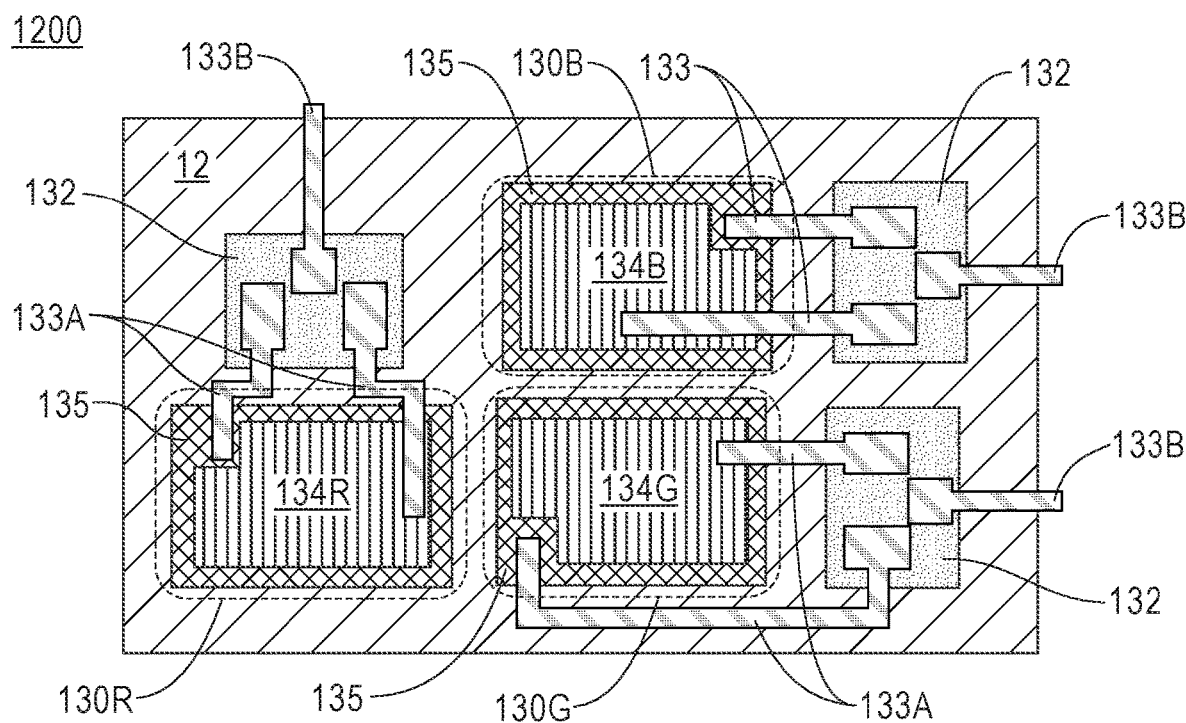
FIG. 12 is a top view of second semiconductor structure with three LED devices and three transistors on a SOI substrate in accordance with an embodiment of the present invention.

FIG. 12 is a top view of semiconductor structure 1200 with three LED devices and three transistors on a SOI substrate in accordance with an embodiment of the present invention. As depicted, FIG. 12 includes LED 130R, interconnects 133A, transistor 132, interconnects 133B, LED 130G, LED 130G, LED 130B, and on silicon layer 12 of the SOI substrate. In various embodiments, each of LED 130R, LED 130G, and LED 130B are one of a red colored LED, a green colored LED, and a blue colored LED, respectively, each LED connects to a transistor of the three transistors 132, in a high-resolution micro-display (e.g., LED 130R connects to associated transistor 132 by two of interconnects 133A). Each of LED 130R, LED 130G, and LED 130B creates one of three different colored LEDs (red, green and blue) that can be formed using processes of FIG. 1 through FIG. 10 where each of the three LEDs uses a combination of two or more elements from group III-V semiconductor materials (e.g., Ga, N, In, Al, or P). In various embodiments, interconnects 133B each connect an associated transistor 132 to a control I/C (not depicted).

In various embodiments, a layer of a compound semiconductor Group III-V material is used to form each of LED 130R, LED 130G, and LED 130B. In order to form LED 130R, 130G, and 130G, a layer of LED layer 134R, a layer of LED layer 134G, and a layer of LED layer 134B, respectively, a layer of an LED material composed of a compound semiconductor material using two or more of Ga, N, Al, In, and P can be epitaxially grown in a trench with dimensions 3 um wide by 3 um long and 3 um deep to 250 um wide by 250 um deep and 250 um deep.

In various embodiments, a layer of a compound semiconductor Group III-nitride material or Group III-phosphide material forms each of LED layer 134R, LED layer 134G, or LED layer 134B. For example, a layer of or AlInGaP or AlGaAs can be used as LED layer 134R in LED 130R to produce a red colored LED. Similarly, a layer of GaN or GaP can be LED layer 134B for LED 130B and a layer of one of GaN or InGaN can be LED layer 134G for LED 134G to produce a green colored LED. In various embodiments, when multiple different Group III-V materials are epitaxially grown on the SOI substrate, the Group III-nitride materials or layers are grown before the Group III-phosphide materials or layers, due to thermal budget considerations.

In various embodiments, spacer 135, composed of any known semiconductor spacer material (e.g., spacer materials used in spacer layer 34 and 98 in FIGS. 3 and 9) surrounds each of LED layer 134R, 134G, and 134B. In various embodiments, a thickness of each of LED layer 134R, LED layer 134G, and LED layer 134B is in the range of 1 to 50 microns.

In various embodiments, using two or more of the semiconductor elements from the group of: Ga, N, In, Al, As, and P for LED layers 134R, 134G, and 134B to form an LED, such as LED 130R, LED 130G, and LED 130B, provides an ability to form red, green and blue micro-LED devices for use in a micro-display. In various embodiments, doping of each of LED layer 134R, LED layer 134G, and LED layer 134B occurs (e.g., n-type doping and p-type doping).

As depicted in FIG. 12, LED 130R connects to adjacent or associated transistor 132 using interconnects 133A and a control I/C (not depicted) by interconnects 133B, LED 130G connects to associated transistor 132 by interconnects 133A and a control I/C (not depicted) by interconnects 133B, and similarly, LED 130B connects to transistor 132 by interconnects 133A and a control I/C (not depicted) by interconnects 133B. Each transistor 132 of the three transistors act as switches for LED 130R, 130G, and 130B, respectively, where the combination of an LED of LED 130R, LED 130G, and LED 130B with one transistor 132 associated to each associated LED device of LED 130R, 130G, and 130B on the SOI substrate can form a pixel in a full-color micro-display. A plurality of each of LED 130R, LED 130G, and LED 130B can be used in forming a high-resolution RGB micro-display.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A full color micro-display, comprising:
a plurality of micro-light emitting diodes in a silicon on insulator substrate, wherein the plurality of micro-light emitting diodes include a plurality of red micro-light emitting diodes, a plurality of green micro-light emitting diodes, and a plurality of blue micro-light emitting diodes; and
a plurality of transistor devices in the silicon on insulator substrate, wherein each transistor device of the plurality of transistor devices acts as a switch connecting to a micro-light emitting diode of the plurality of micro-light emitting diodes.

2. The full color micro-display of claim 1, wherein the silicon on insulator substrate has a bottom layer of silicon with a surface in a (111) crystal orientation and a top layer of silicon with a surface in a (100) crystal orientation.

3. The full color micro-display of claim 1, wherein the plurality of red micro-light emitting diodes, the plurality of green micro-light emitting diodes, and the plurality of blue micro-light emitting diodes are formed using gallium nitride.

4. The full color micro-display of claim 3, wherein a layer of gallium nitride is coated with a phosphor material to creates the plurality of red micro-light emitting diodes, a layer of GaN creates the plurality of blue micro-light emitting diodes, and a layer of gallium nitride coated with an epoxy phosphate material creates the plurality of green micro-light emitting diodes.

5. The full color micro-display of claim 3, wherein a layer of gallium nitride is coated with a first quantum dot creating the plurality of red micro-light emitting diodes, a layer of GaN creates the plurality of blue micro-light emitting diodes, and a layer of gallium nitride coated with a second quantum dot creates the plurality of green micro-light emitting diodes.

6. The full color micro-display of claim 1, wherein each micro-light emitting diode of the plurality of micro-light emitting diodes in the silicon on insulator substrate has a size of 3 um by 3 um to 250 um by 250 um.

7. The full color micro-display of claim 1, wherein the plurality of transistor devices in the silicon on insulator substrate provide a maximum current capacity of 10 mA.

8. The full color micro-display of claim 1, wherein the plurality of transistor devices in the silicon on oxide substrate connect to a control I/C device.

9. A full color micro-display, comprising:
a plurality of micro-light emitting diodes in a silicon on insulator substrate, wherein the plurality of micro-light emitting diodes include a plurality of red micro-light emitting diodes, a plurality of green micro-light emitting diodes, and a plurality of blue micro-light emitting diodes, wherein each of red micro-light emitting diodes, each of the green micro-light emitting diodes, and each of the blue micro-light emitting diodes are formed using a different light-emitting compound Group III-V semiconductor material; and
a plurality of transistor devices in the silicon on insulator substrate, wherein each transistor device of the plurality of transistor devices, acting as a switch, connects to a micro-light emitting diode of the plurality of micro-light emitting diodes in the silicon on insulator substrate.

10. The full color micro-display of claim 9, wherein the plurality of red micro-light emitting diodes, the plurality of green micro-light emitting diodes, and the plurality of blue micro-light emitting diodes are each formed from two or more elements from a group of: gallium, nitride, aluminum, indium, arsenic, and phosphorous.

11. The full color micro-display of claim 9, wherein the plurality of red micro-light emitting diodes are formed using one of AlInGaP or AlGaAs.

12. The full color micro-display of claim 9, wherein the plurality of green micro-light emitting diodes are formed using of one InGaN, GaP, or GaN.

13. The full color micro-display of claim 9, wherein the plurality of blue micro-light emitting diodes are formed using one of GaN, GaP, or InGaN.

14. The full color micro-display of claim 9, wherein each LED of the plurality of micro-light emitting diodes in the silicon on insulator substrate has a size of 3 um by 3 um to 250 um by 250 um.

15. The full color micro-display of claim 9, wherein each transistor of the plurality of transistor devices provide a maximum current capacity of 10 mA.

16. The full color micro-display of claim 14, wherein a transistor of the plurality of transistor devices and a micro-light emitting diode of the plurality of micro-light emitting diodes form a pixel.

* * * * *